United States Patent
Teng et al.

(10) Patent No.: US 11,276,670 B2
(45) Date of Patent: Mar. 15, 2022

(54) SEMICONDUCTOR DEVICE AND MANUFACTURING METHOD OF SEMICONDUCTOR DEVICE

(71) Applicant: Taiwan Semiconductor Manufacturing Co., Ltd., Hsinchu (TW)

(72) Inventors: Yi-Chuan Teng, Hsinchu County (TW); Victor Chiang Liang, Hsinchu (TW); Jung-Kuo Tu, Hsinchu (TW); Ching-Kai Shen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 69 days.

(21) Appl. No.: 16/851,114

(22) Filed: Apr. 17, 2020

(65) Prior Publication Data
US 2021/0327852 A1    Oct. 21, 2021

(51) Int. Cl.
| H01L 21/00 | (2006.01) |
| H01L 25/065 | (2006.01) |
| H01L 21/768 | (2006.01) |
| H01L 23/522 | (2006.01) |
| H01L 23/00 | (2006.01) |
| H01L 25/00 | (2006.01) |
| H01L 23/48 | (2006.01) |

(52) U.S. Cl.
CPC .... *H01L 25/0657* (2013.01); *H01L 21/76898* (2013.01); *H01L 23/481* (2013.01); *H01L 23/5226* (2013.01); *H01L 24/29* (2013.01); *H01L 24/83* (2013.01); *H01L 24/94* (2013.01); *H01L 25/50* (2013.01)

(58) Field of Classification Search
CPC ........... H01L 25/0657; H01L 21/76898; H01L 23/481
See application file for complete search history.

(56) References Cited

U.S. PATENT DOCUMENTS

| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 * | 10/2016 | Tsai ................... H01L 24/83 |
| 9,496,189 | B2 | 11/2016 | Yu et al. |
| 9,666,502 | B2 | 5/2017 | Chen et al. |
| 9,735,131 | B2 | 8/2017 | Su et al. |
| 10,998,293 | B2 * | 5/2021 | Chen ................... H01L 24/08 |

(Continued)

*Primary Examiner* — Laura M Menz
(74) *Attorney, Agent, or Firm* — JCIPRNET

(57) ABSTRACT

A semiconductor device includes a first integrated circuit and a second integrated circuit. The first integrated circuit includes a semiconductor substrate and a dielectric layer disposed on a top surface of the semiconductor substrate. The second integrated circuit is disposed on the dielectric layer of the first integrated circuit and includes a dummy opening extending through the second integrated circuit and having a metal layer covering the inner walls of the dummy opening and in contact with the dielectric layer, wherein the metal layer is electrically grounded or electrically floating.

20 Claims, 4 Drawing Sheets

(56) References Cited

U.S. PATENT DOCUMENTS

| | | | | |
|---|---|---|---|---|
| 2014/0264930 A1* | 9/2014 | Yu | ................... | H01L 23/5389 |
| | | | | 257/774 |
| 2019/0326239 A1* | 10/2019 | Ku | ................... | H01L 24/96 |
| 2020/0402960 A1* | 12/2020 | Chen | ................... | H01L 23/3121 |
| 2021/0057309 A1* | 2/2021 | Hu | ................... | H01L 25/50 |
| 2021/0118827 A1* | 4/2021 | Chen | ................... | H01L 23/645 |
| 2021/0327852 A1* | 10/2021 | Teng | ................... | H01L 25/0657 |

\* cited by examiner

SEMICONDUCTOR DEVICE AND MANUFACTURING METHOD OF SEMICONDUCTOR DEVICE

BACKGROUND

In today's electronics industry, advanced packaging techniques are being developed and continue to be developed to increase levels of integration. Semiconductor devices are formed on a semiconductor substrate, also known as a wafer, which includes a multitude of individual semiconductor devices, known as chips after they are separated from one another. After semiconductor devices are formed on a semiconductor substrate, and separated into the individual chips, the chips must be bonded to other chips and/or other components and it is logically desirable to join as many semiconductor chips as possible in a package of reduced size.

All of the bonding techniques used in chip to chip bonding involve joining opposed surfaces of the bonding materials formed on the respective chips. The bonding materials may be a metal or a metal alloy and in each case, it is a challenge to provide good contact and a strong bond between the bonding materials of the respective chips especially since the bonding surfaces are prone to oxidation after they have been formed and patterned and the presence of a surface oxide limits metal to metal diffusion such as needed to form a strong metal bond. The time delay between the deposition of the bonding material, the patterning of the bonding material and the actual bonding can be considerable and the metal surfaces can oxidize during these time delays, inhibiting the subsequent metal diffusion between bonding surfaces and degrading bonding strength and quality, adversely impacting the package's quality. It would therefore be desirable to overcome these limitations and provide a method and structure that provides high bonding strength.

Wafer Level Chip Scale Packaging, WLCSP, and other hermetic packaging techniques bond chips directly together and can be used to produce finer pitch semiconductor device packages and products that do not require wires or pins but instead utilize contact pads. Direct chip to chip, also referred to as wafer to wafer bonding techniques are utilized in such advanced packaging techniques and require superior wafer bonding strength for package qualification. Each of these aspects requires high quality bonding surfaces to be joined together. Moreover, where molding delamination from the wafer has occurred, the edges of chips of the wafer may be more susceptible to cracking, chipping, and/or corrosive environmental influences during the subsequent dicing process and associated handling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
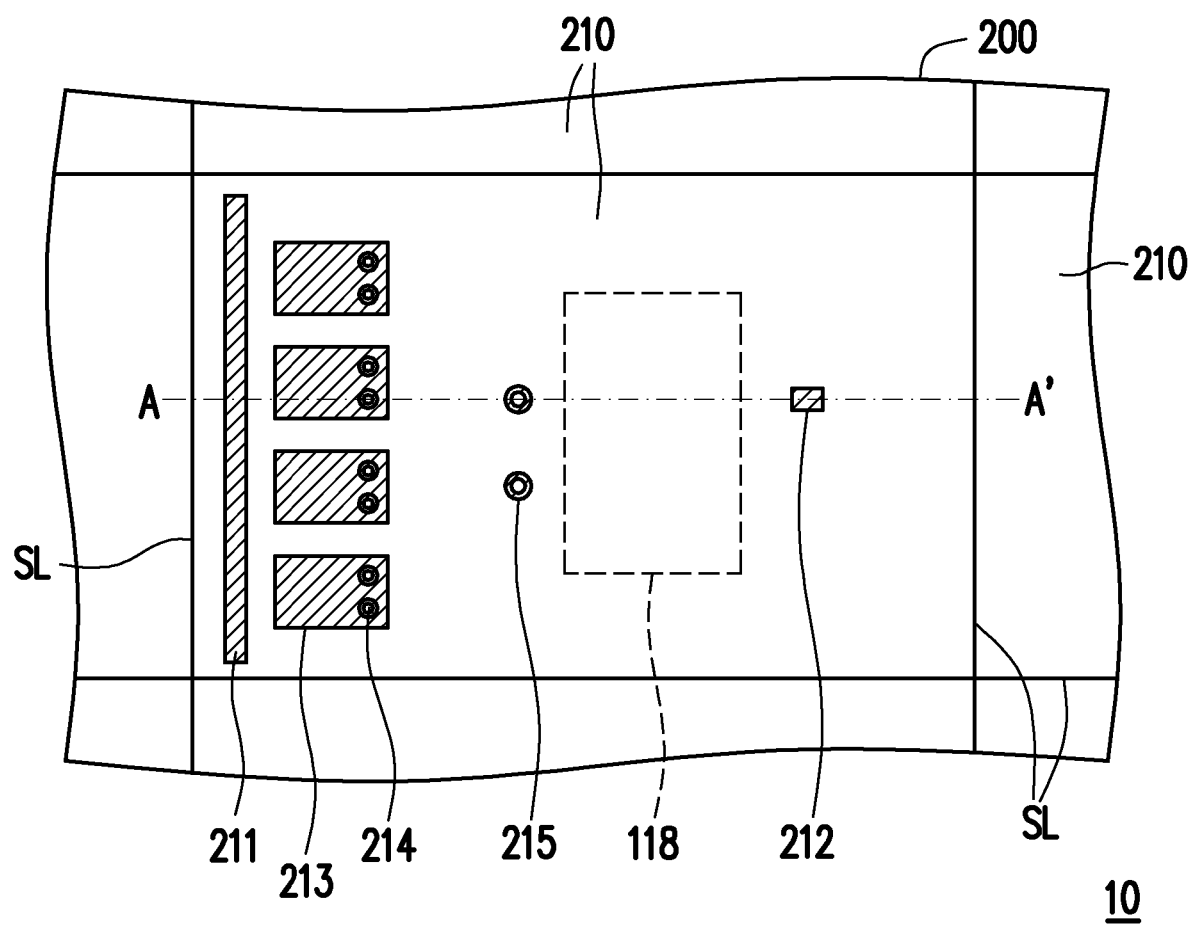
FIG. 1 illustrates a top view of a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 2:
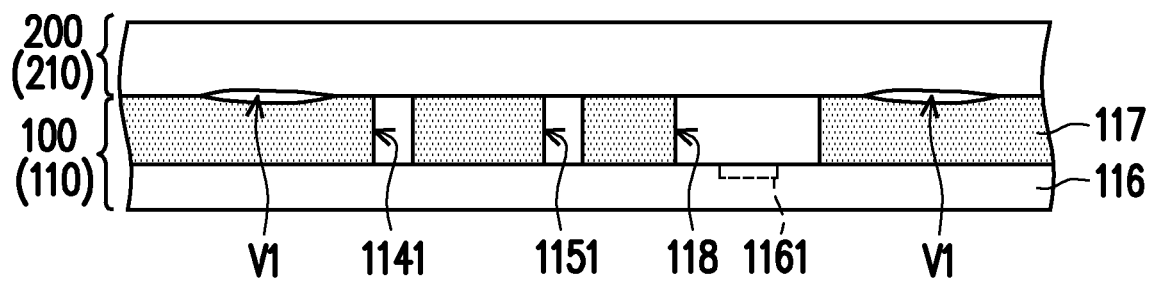
FIG. 2 to FIG. 4 illustrate cross sectional views of an intermediate stage in a manufacturing of a semiconductor device according to some exemplary embodiments of the present disclosure.
Figure 3:
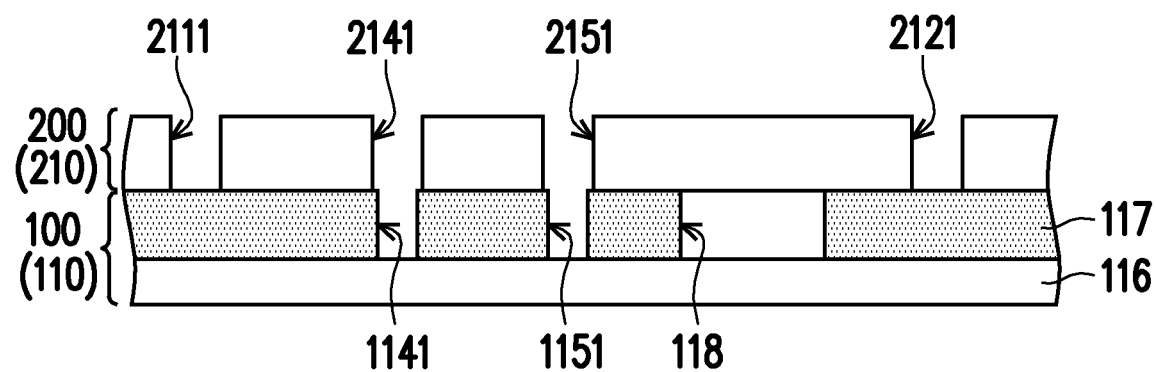
Figure 4:
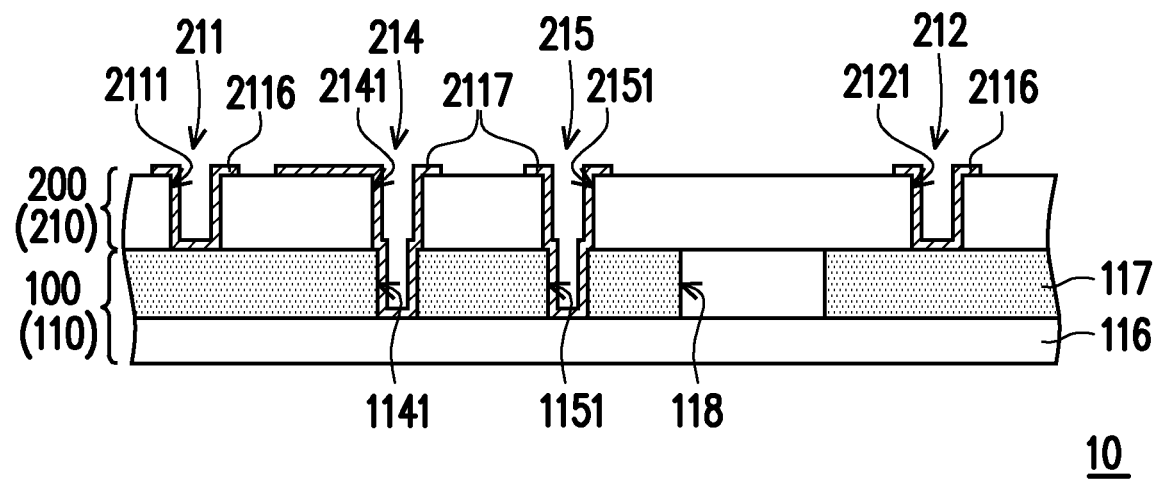

FIG. 1 illustrates a top view of a semiconductor device according to some exemplary embodiments of the present disclosure. FIG. 2 to FIG. 4 illustrate cross sectional views of an intermediate stage in a manufacturing of a semiconductor device according to some exemplary embodiments of the present disclosure. It is noted that FIG. 4 is a cross sectional view of a semiconductor device 10 along A-A' line shown in FIG. 1. Some components may be omitted in the top view of the semiconductor device 10 in FIG. 1 for the simplicity of the drawings. Aspects of the disclosure provide a semiconductor device and a manufacturing (bonding) method applicable to wafer-to-wafer bonding with improved wafer to wafer bonding strength and hermetic quality. However, the disclosure is not limited thereto. The semiconductor device and the manufacturing (bonding) method in the disclosure may also be applied to bond any kinds of substrates bonded together.

In accordance with some embodiments of the disclosure, a manufacturing method of the semiconductor device 10 may include the following steps. Referring to FIG. 1 and FIG. 2, in some embodiments, a first wafer 100 is provided. In some embodiments, the first wafer 100 may be provided on a bonding apparatus (not shown), which may include a chuck and a bonding head. The chuck is configured to carry a plurality of wafers (e.g. the first wafer 100 and the second wafer 200 shown in FIG. 2) to be bonded. It is noted that two wafers (e.g. the first wafer 100 and the second wafer 200 shown in FIG. 2) are illustrated in the present embodiment. However, the disclosure is not limited thereto. In other embodiments, more than two wafers can be provided for being bonded together. In some embodiments, the first wafer 100 may include a semiconductor substrate 116 and a dielectric layer 117 disposed over the substrate 116.

Then, a second wafer 200 is bonded over the dielectric layer 117 of the first wafer 100. In the present embodiment, the first wafer 100 and the second wafer 200 may be bonded in a face to face manner, and the bonding method of the first wafer 100 and the second wafer 200 may include dielectric-to-dielectric bonding (also referred to as fusion bonding), but the disclosure is not limited thereto. In an alternative embodiment, the bonding method of the first wafer 100 and the second wafer 200 may also include copper-to-copper bonding, solder bonding, or the like. In accordance with some embodiments of the disclosure, each of the first wafers 100 and the second wafer 200 may be a chip containing individual integrated circuit or an integrated substrate with multiple individual integrated circuits. In some embodiments, each of the first wafers 100 and the second wafer 200 may include a semiconductor substrate (e.g. the semiconductor substrate 116 of the first wafer 100 shown in FIG. 2), which includes a plurality of integrated circuits (e.g. the integrated circuits 210 of the second wafer 200 shown in FIG. 1) formed using various technologies. The semiconductor substrates of the first wafers 100 and the second wafer 200 may each include a silicon in a crystalline structure. In an alternative embodiments, each of the semiconductor substrates may have an epitaxial layer overlying a bulk semiconductor. Furthermore, the semiconductor substrates may be strained for performance enhancement. For example, the epitaxial layer may comprise semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, each of the semiconductor substrates may include a semiconductor-on-insulator (SOI) structure. For example, each of the semiconductor substrates may include a buried oxide (BOX) layer formed by a process such as separation by implanted oxygen (SIMOX). In some embodiments, each of the semiconductor substrates may include various doped wells, doped features, and semiconductor layers configured to form various electronic devices such as metal oxide semiconductor field effect transistor (MOSFET) including complementary metal oxide semiconductor (CMOS), imaging sensor including CMOS imaging sensor (CIS), micro electro-mechanical system (MEMS), memory cells, and/or other suitable active and passive devices.

In some embodiments, the first wafer 100 and the second wafer 100 may each include an interconnect structure with one or more metal layers that are configured to connect various doped regions and/or features in the respective semiconductor substrate, resulting in the functional circuit. The interconnect structure may include conductive materials such as copper, copper alloy, titanium, titanium nitride, tantalum, tantalum nitride, tungsten, polysilicon, metal silicide, or combinations. The copper interconnect may be formed by a technique such as CVD, sputtering, plating, or other suitable processes. Alternatively or additionally, an aluminum interconnect may be used and include an aluminum, aluminum/silicon/copper alloy, titanium, titanium nitride, tungsten, polysilicon, metal silicide, or combinations. The aluminum interconnect may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line).

The interconnect structures of the first wafer 100 and the second wafer 200 may each include an inter-layer dielectric (e.g. the dielectric layer 117 of the first wafer 100 shown in FIG. 2) with a low dielectric constant. The dielectric layer (117) may be provided on the semiconductor substrate (116) and include silicon dioxide, silicon nitride, silicon oxynitride, polyimide, spin-on glass (SOG), fluoride-doped silicate glass (FSG), carbon doped silicon oxide, Xerogel, Aerogel, amorphous fluorinated carbon, Parylene, BCB (bis-benzocyclobutenes), SiLK (Dow Chemical, Midland, Mich.), and/or other suitable materials. The dielectric layer may be formed by a technique including spin-on, CVD, sputtering, or other suitable processes. The metal layers and inter-layer dielectric may be formed in an integrated process such as a damascene process or lithography/plasma etching process. Conventional semiconductor fabrication methods may be used to produce the first wafers 100 and the second wafer 200 to include various electronic devices (e.g. the electronic device 1161 of the first wafer 100 shown in FIG. 2) thereon such as CMOS (Complementary Metal Oxide Semiconductor) devices and/or MEMS (micro electromechanical structure) devices, or the like.

The circuitry formed on the substrate may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in the one or more dielectric layers.

In some embodiments of the disclosure, accordingly, a plurality of integrated circuits 110, and 210 are manufactured on each of the first wafer 100 and the second wafer 200. The integrated circuits are separated after the manufacturing process is complete by sawing the integrated circuits apart along a plurality of scribe lines SL at edges of each integrated circuit. The integrated circuits may then be individually packaged, or be packaged in multi-chip modules, as examples. Take the second wafer 200 for example, the integrated circuits 210 are arranged in an array manner and defined by a plurality of scribe lines SL at edges of each of the integrated circuits 210 as shown in FIG. 1. In other words, a series of scribe lines SL are interjacent and separate respective ones of the plurality of integrated circuits 210.

In some exemplary embodiments, the semiconductor manufacturing process may be part of a wafer level packaging process. In the present embodiment, one of the integrated circuits 110 and the respective one of the integrated circuits 210 are shown to represent plural integrated circuits 110 and 210 of the first wafer 100 and the second wafer 200. Namely, one of the stacked integrated circuits structure is shown to represent plural stacked integrated circuits structures obtained by the semiconductor manufacturing process shown in FIG. 2 to FIG. 4 and FIG. 6 to FIG. 8. Throughout the following description, when it comes to the process regarding the integrated circuits 110 and 210, it may refer to a chip (integrated circuit) level process or a wafer (plural integrated circuits) level process. The disclosure is not limited thereto. Namely, "integrated circuit" described in the following manufacturing process may refer to "integrated circuit" or "wafer".

Referring to FIG. 2, in some exemplary embodiments, a plurality of vias 1141, 1151 may be formed on the dielectric layer 117. In some embodiments, the vias 1141, 1154 extend through the dielectric layer 117 and are configured for forming functional vias, which electrically connect the first integrated circuits 110 and the second integrated circuit 210, in subsequent processes. It is noted that two vias 1141, 1151 are illustrated in the cross sectional view of FIG. 2, but one of ordinary skills in the art should understand that more or less than two vias may be applied on the dielectric layer 117.

In accordance with some embodiments of the disclosure, a cavity 118 may be formed on the dielectric layer 117. In some embodiments, the cavity 118 is formed by the removal of a portion of the dielectric layer 117. The cavity 118 is configured to reveal an electronic device 1161 formed on the semiconductor substrate 116. In some embodiments, the electronic device 1161 may be a MEMS device having a movable element. The cavity 118 formed over the electronic device 1161 to allow the movable element for free movement in at least one axis. The movable element may be supported by hinges, springs, beams, or the like which extend from the static elements of the MEMS device. In an embodiment, the portions of the dielectric layer 117 may be removed by an etch process. The etch process may be a diluted hydrofluoric acid (DHF) treatment or a vapor hydrofluoric acid (VHF) treatment for a suitable time. The etch process for forming the vias 1141, 1151 and the cavity 118 may be performed before or after the second integrated circuit 210 is bonded to the first integrated circuits 110. These type of etch processes have high selectivity between the dielectric layer 117, the first integrated circuits 110, and the second integrated circuit 210, so that the first integrated circuits 110 and the second integrated circuit 210 are not significantly attacked during the removal of the dielectric layer 117. Note further that a protective component may be provided to protect portions of the dielectric layer 117 over the static elements of the MEMS device during the etch process. The disclosure is not limited thereto.

Generally speaking, when the first integrated circuits 110 and the second integrated circuit 210 are bonded together, the bonding surfaces of the first integrated circuits 110 and the second integrated circuit 210 may not be completely attached to each other. In other words, voids V1 may exist between the bonding surfaces of the first integrated circuits 110 and the second integrated circuit 210 and may cause undesirable defects such as delamination.

Accordingly, referring to FIG. 3, in some embodiments, at least one through opening (two through opening 2111 and 2121 are illustrated but not limited thereto) are formed on the second integrated circuit 210. In some embodiments, the through opening 2111 and the through opening 2121 extend through the second integrated circuit 210 and reveals the dielectric layer 117 of the first integrated circuits 110 underneath respectively. With such configuration, air trapped in the void V1 can be dissipated through the through opening 2111 and the through opening 2121, risks of delamination between the first integrated circuits 110 and the second integrated circuit 210 can be avoid or at least significantly reduced, and the bonding strength of the first integrated circuits 110 and the second integrated circuit 210 can be improved. It is noted that two through openings 2111, and 2121 are illustrated in the cross sectional view of FIG. 3; however, one of ordinary skills in the art should understands that more or less than two through openings may be formed on the second integrated circuit 210.

In some exemplary embodiments, a plurality of through vias 2141, 2151 are formed on the second integrated circuit 210. The through vias 2141 and the through vias 2151 are formed correspondingly to the vias 1141 and the vias 1151, so as to communicate with respective ones of the vias 1141 and the vias 1151. That is, in some embodiments, the through vias 2141 and the through vias 2151 are aligned with the vias 1141 and the vias 1151 respectively. It is noted that two through vias 2141 and 2151 are illustrated in the cross sectional view of FIG. 3; however, one of ordinary skills in the art should understands that more or less than two through vias may be formed on the second integrated circuit 210. The number of the through vias on the second integrated circuit 210 may depend on the number of the vias on the first integrated circuits 110.

Referring to FIG. 4, in some embodiments of the disclosure, a metal layer 2116 is formed on the through openings 2111 to form a plurality of dummy openings 211. In some embodiments, the metal layer 2116 covers the inner walls of the through openings 2111 and 2121 and is in contact with the dielectric layer 114 that is exposed by the through openings 2111 and 2121. In the same manufacturing process, a metal layer 2117 may be formed on the through vias 2141, 2151 and the vias 1141, 1151 to form the functional vias 214 and 215. The metal layer 2117 covers the inner walls of the through vias 2141, 2151 and the vias 1141, 1151. The metal layer 2117 may be in contact with top metal (circuits and/or pads) formed on the semiconductor substrate 10, so as to electrically connect the first integrated circuits 110 and the second integrated circuit 210 through the functional vias 214 and 215.

In some exemplary embodiments, a diameter of each of the vias 1141 and 1151 may be substantially smaller than a diameter of each of the through vias 2141 and 2151. With such configuration, the through vias 2141 and 2151 with larger diameters and the vias 1141 and 1151 with smaller diameters can jointly function as rivets to rivet the first integrated circuit 110 and the second integrated circuit 210 together. Accordingly, the configuration of the functional vias 214 and 215 can further improve the bonding strength between the first integrated circuit 110 and the second integrated circuit 210.

In some embodiments, the metal layer 2116 and the metal layer 2117 can be formed in one single step and by the same process such as sputtering, evaporation, or electroless plating, etc. That is to say, the metal layer 2116 and the metal layer 2117 are actually formed from the same layer of metal. The material of the metal layer 2116 and the metal layer 2117 may include copper, or any other suitable materials. In some embodiments, the metal layer 2116 is electrically grounded or electrically floating. In one of the embodiments, the metal layer 2116 is electrically insulated from the metal layer 2117. Accordingly, the dummy openings 211 and 212 may be electrically connected to a ground electrode and electrically insulated from the functional vias 214 and 215.

Figure 5:
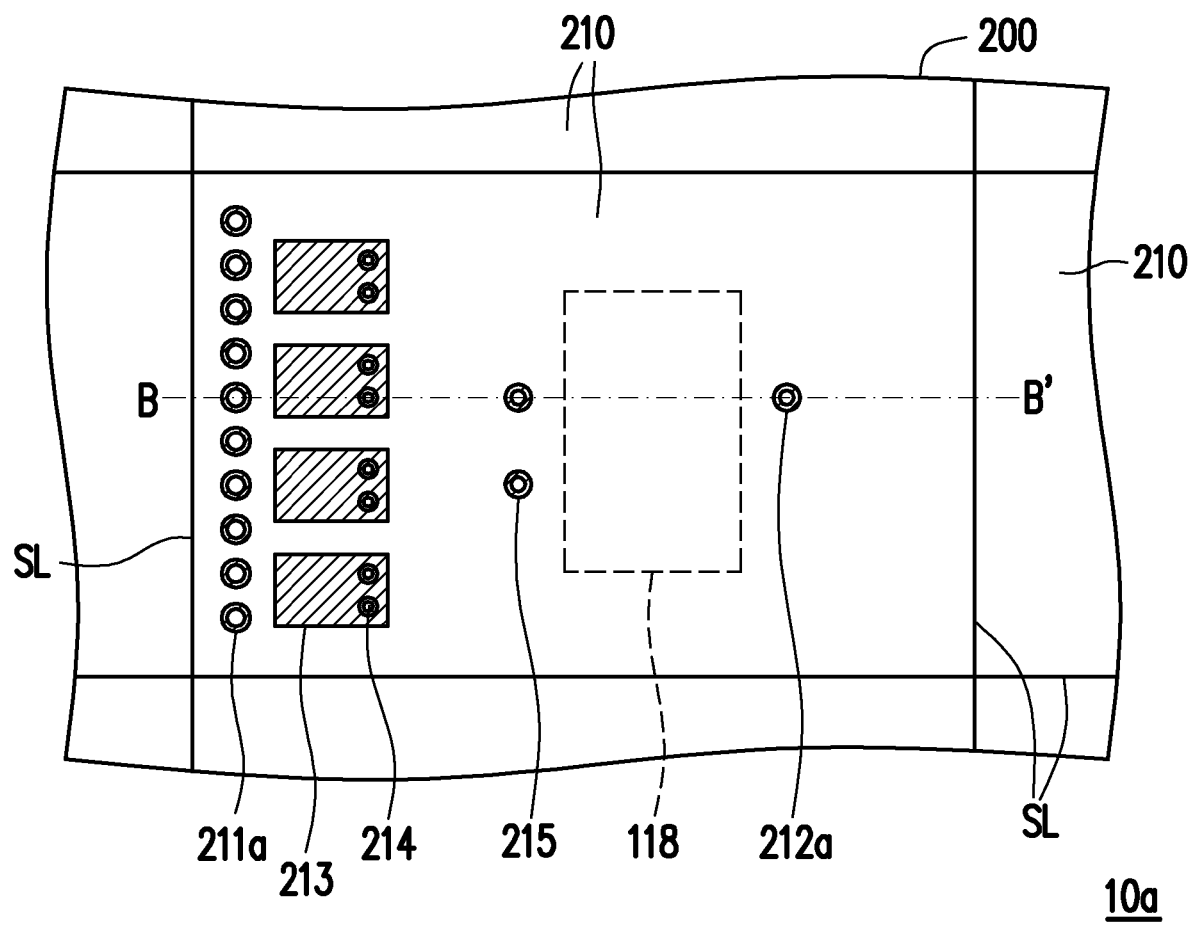
FIG. 5 illustrates a top view of a semiconductor device according to some exemplary embodiments of the present disclosure.

Referring to FIG. 1 and FIG. 4, in some exemplary embodiments, the second integrated circuit 210 further include at least one (functional) pad 213 (four pads are illustrated but not limited thereto). The pads 213 are electrically insulated from the dummy opening 211. In some embodiments, the pads 213 are electrically connected to the functional vias 214 and/or the functional vias 215. In fact, in some of the implementation, the functional vias 214 are the vias in the pads 213 for electrically connecting the pads 213 and the top metal of the first integrated circuit 110. In some embodiments, the dummy opening 211 may be disposed between the pad 213 and an edge of the second integrated circuit 210 closest to the pad 213. In a wafer level process, the dummy openings is 211a is disposed between the pad 213 and respective one of the scribe lines SL that is closest to the pad 213 as shown in FIG. 5.

In general, the scribe lines SL are defined in areas of the multi-layer structure of the first wafer 100 and second wafer 200 that are without a circuit pattern. Furthermore, when at least one layer of the multi-layer structure is composed of a metal material with a high thermal expansion coefficient, the dimensional variation of the layer is sufficient to introduce high-level internal stress into the wafer in the area of the scribe line SL. Consequently, portions of the first wafer 100 and the second wafer 200 around the scribe line SL suffer damage, such as delamination and/or cracking, especially during sawing (singulation) process.

Accordingly, in the present embodiments, the dummy opening 211 is disposed between the pad 213 and an edge (i.e. scribe line SL) of the second integrated circuit 210 (i.e. the second wafer 200) closest to the pad 213. Thereby, when the crack occur from the scribe line SL, it would stop at the dummy opening 211 instead of extend all the way toward the pad 213. In some embodiments, the dummy opening 211 is a trench extending along a direction parallel to the edge (i.e. scribe line SL) of the second integrated circuit 210 (i.e. the second wafer 200) as it is shown in FIG. 1.

In some embodiments, the dummy opening 212 may be disposed on a region corresponding to a periphery of the cavity 118. It is shown that voids V1 are more likely occurred around the cavity 118, so by forming the dummy opening 212 at the region around the cavity 118, the air trapped in the voids V1 can be release. Therefore, the risk of delamination between the first integrated circuits 110 and the second integrated circuit 210 can be avoid or at least significantly reduced. However, the disclosure does not limit the disposition of the dummy openings 211, 212. The locations of the dummy openings 211 and 212 may be modified according to actual requirements of the semiconductor device 10.

With such configuration, the dummy opening 211 and 212 not only can release the air trapped in the void V1 between the first integrated circuits 110 and the second integrated circuit 210, but also can prevent the crack occurred from the scribe line SL to be extended to the pads 213 and damage the semiconductor device 10. Therefore, risks of delamination between the first integrated circuits 110 and the second integrated circuit 210 can be avoid or at least significantly reduced, and the bonding strength and the reliability of the semiconductor device 10 can be significantly improved.

It is noted that the semiconductor device 10a shown in FIG. 5 to FIG. 8 contains many features same as or similar to the semiconductor device 10 disclosed earlier with FIG. 1 to FIG. 4. For purpose of clarity and simplicity, detail description of same or similar features may be omitted, and the same or similar reference numbers denote the same or like components. The main differences between the semiconductor device 10a shown in FIG. 5 to FIG. 8 and semiconductor device 10 disclosed earlier with FIG. 1 to FIG. 4 are described as follows.

Figure 6:
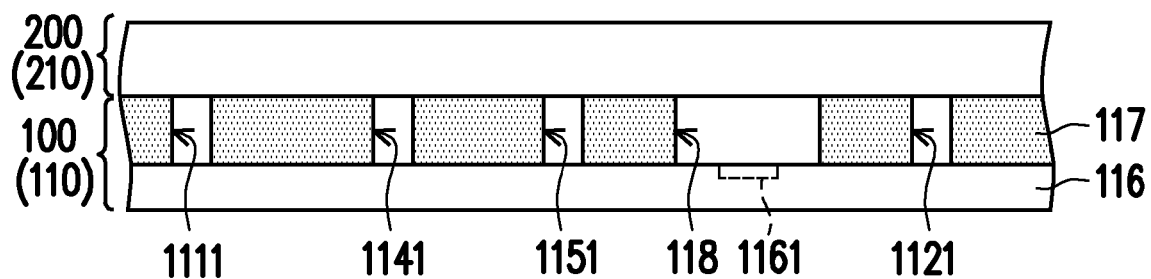
FIG. 6 to FIG. 8 illustrate cross sectional views of an intermediate stage in a manufacturing of a semiconductor device according to some exemplary embodiments of the present disclosure.
Figure 7:
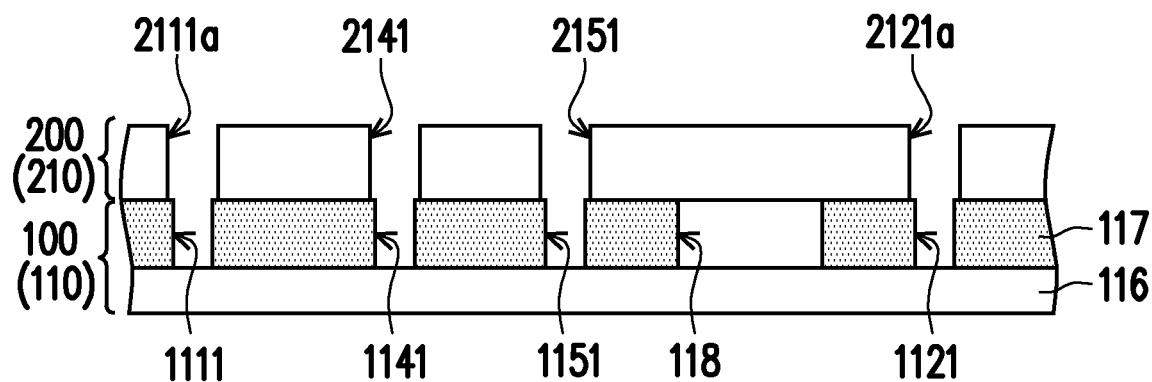
Figure 8:
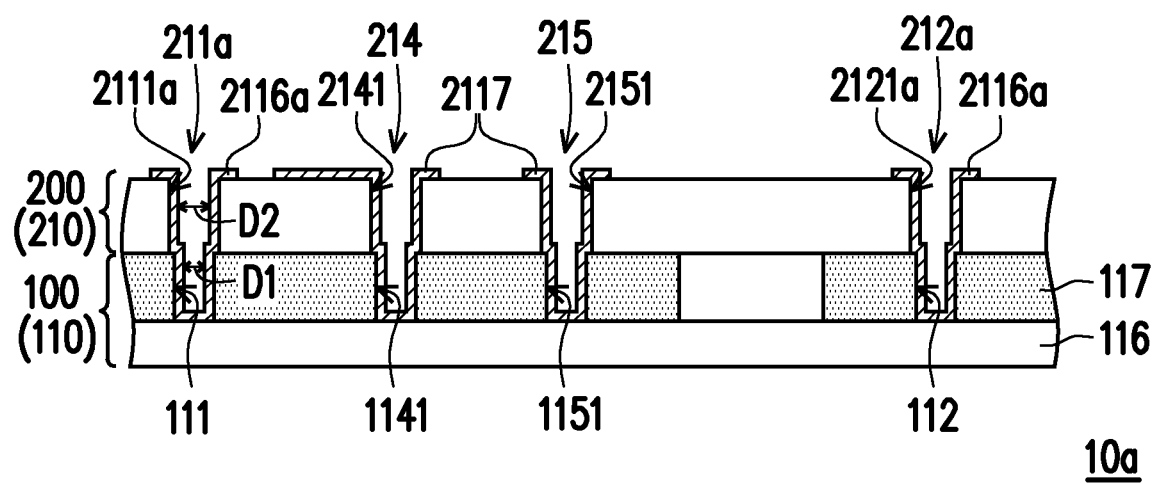

FIG. 5 illustrates a top view of a semiconductor device according to some exemplary embodiments of the present disclosure. FIG. 6 to FIG. 8 illustrate cross sectional views of an intermediate stage in a manufacturing of a semiconductor device according to some exemplary embodiments of the present disclosure. It is noted that FIG. 8 is a cross sectional view of a semiconductor device 10a along B-B' line shown in FIG. 5. Some components may be omitted in the top view of the semiconductor device 10a in FIG. 5 for the simplicity of the drawings. Referring to FIG. 6, in some exemplary embodiments, a plurality of vias 1141, 1151 (two vias are illustrate herein but not limited thereto) may be formed on the dielectric layer 117. In the present embodiment, at least one sub opening (two sub openings 1111 and 1121 are illustrate herein but not limited thereto) are also formed on the dielectric layer 117 of the first integrated circuit 110. In some embodiments, the vias 1141, 1154 extend through the dielectric layer 117 and are configured to form a plurality of functional vias 214 and 215, which electrically connect the first integrated circuits 110 and the second integrated circuit 210, in subsequent processes. Similarly, the sub openings 1111 and 1121 extend through the dielectric layer 117 and are configured to form a plurality of sub dummy opening 211a and 212a, which electrically insulated from the functional vias 214 and 215, in subsequent processes. It is noted that the number of the vias and the number of the sub openings are not limited thereto.

In accordance with some embodiments of the disclosure, a cavity 118 may be formed on the dielectric layer 117. In some embodiments, the cavity 118 is formed by the removal of a portion of the dielectric layer 117. The cavity 118 is configured to reveal an electronic device 1161 formed on the semiconductor substrate 116. In some embodiments, the electronic device 1161 may be a MEMS device having a movable element. The cavity 118 formed over the electronic device 1161 to allow the movable element for free movement in at least one axis. The movable element may be supported by hinges, springs, beams, or the like which extend from the static elements of the MEMS device. In an embodiment, the portions of the dielectric layer 117 may be removed by an etch process. The etch process may be a diluted hydrofluoric acid (DHF) treatment or a vapor hydrofluoric acid (VHF) treatment for a suitable time. The etch process for forming the vias 1141, 1151 and the cavity 118 may be performed before or after the second integrated circuit 210 is bonded to the first integrated circuits 110. These type of etch processes have high selectivity between the dielectric layer 117, the first integrated circuits 110, and the second integrated circuit 210, so that the first integrated circuits 110 and the second integrated circuit 210 are not significantly attacked during the removal of the dielectric layer 117. Note further that a protective component may be provided to protect portions of the dielectric layer 117 over the static elements of the MEMS device during the etch process. The disclosure is not limited thereto.

Referring to FIG. 7, in some embodiments, at least one through opening (two through opening 2111a and 2121a are illustrated but not limited thereto) are formed on the second integrated circuit 210. In some embodiments, the through opening 2111a and the through opening 2121a extend through the second integrated circuit 210 and reveals the dielectric layer 117 of the first integrated circuits 110 underneath respectively. In the present embodiment, the through openings 2111a and the through opening 2121a are formed corresponding to respective ones of the sub openings 1111 and the sub opening 1121. In other words, the through openings 2111a and the through opening 2121a communicate with the sub opening 1111 and the sub opening 1112 respectively. In one of the implementations, the through openings 2111a and the through opening 2121a are aligned with the sub opening 1111 and the sub opening 1121 respectively.

With such configuration, air trapped in the void V1 (between the dielectric layer 117 and the second integrated circuit 210) can be dissipated through the through opening 2111a and the through opening 2121a, risks of delamination between the first integrated circuit 110 and the second integrated circuit 210 can be avoid or at least significantly reduced. Thereby, the bonding strength of the first integrated circuit 110 and the second integrated circuit 210 can be improved. It is noted that two through openings 2111a, and 2121a are illustrated in the cross sectional view of FIG. 7; however, one of ordinary skills in the art should understands that more or less than two through openings may be formed on the second integrated circuit 210.

In some exemplary embodiments, a plurality of through vias 2141, 2151 are formed on the second integrated circuit 210. The through vias 2141 and the through vias 2151 are formed correspondingly to the vias 1141 and the vias 1151, so as to communicate with respective ones of the vias 1141 and the vias 1151. That is, in some embodiments, the through vias 2141 and the through vias 2151 are aligned with the vias 1141 and the vias 1151 respectively. The number of the through vias on the second integrated circuit 210 may depend on the number of the vias on the first integrated circuits 110.

Referring to FIG. 8, in some embodiments of the disclosure, a metal layer 2116a is formed on the through openings 2111a and 2121a and the sub openings 1111 and 1121 to form a plurality of dummy openings 211a and 212a and a plurality of sub dummy openings 111 and 112 communicating with the dummy openings 211a and 212a. In some embodiments, the dummy openings 211a and 212a and the sub dummy openings 111 and 112 are (rounded) dummy vias. In some embodiments, the metal layer 2116a covers the inner walls of the through openings 2111a and 2121a and the inner walls of the sub openings 1111 and 1121. In addition, the metal layer 2116a is in contact with the dielectric layer 114 that is exposed by the through openings 2111a and 2121a. In some exemplary embodiments, a diameter D1 of at least one of the sub dummy openings 111 and 112 is substantially smaller than a diameter D2 of at least one of the dummy openings 211a and 212a. With such configuration, the dummy openings 211a and 212a with larger diameters D2 and the sub dummy openings 111 and 112 with smaller diameters D1 can jointly function as rivets to rivet the first integrated circuit 110 and the second integrated circuit 210 together. Each of the dummy opening 211a/212a along with the respective one of the sub dummy opening 111/112 may be referred to as a "dummy via" as a whole hereinafter. Accordingly, the configuration of the dummy vias not only can reduce the risk of delamination between the first integrated circuit 110 and the second integrated circuit but also can function as a rivet to rivet the first integrated circuit 110 and the second integrated circuit 210 together. Thereby, the bonding strength between the first integrated circuit 110 and the second integrated circuit 210 can be further improve.

In the same manufacturing process, a metal layer 2117 may be formed on the through vias 2141, 2151 and the vias 1141, 1151 to form the functional vias 214 and 215. The metal layer 2117 covers the inner walls of the through vias 2141, 2151 and the vias 1141, 1151. The metal layer 2117 may be in contact with top metal (circuits and/or pads) formed on the semiconductor substrate 10, so as to electrically connect the first integrated circuits 110 and the second integrated circuit 210 through the functional vias 214 and 215. In some exemplary embodiments, a diameter of at least one of the vias 1141 and 1151 is substantially smaller than a diameter of at least one of the through vias 2141 and 2151. With such configuration, the through vias 2141 and 2151 with larger diameters and the vias 1141 and 1151 with smaller diameters can jointly function as rivets to rivet the first integrated circuit 110 and the second integrated circuit 210 together. Accordingly, the configuration of the functional vias 214 and 215 can further improve the bonding strength between the first integrated circuit 110 and the second integrated circuit 210.

In some embodiments, the metal layer 2116a and the metal layer 2117 can be formed in one single step and by the same process such as sputtering, evaporation, or electroless plating, etc. That is to say, the metal layer 2116a and the metal layer 2117 are actually formed from the same layer of metal. The material of the metal layer 2116a and the metal layer 2117 may include copper, or any other suitable materials. In some embodiments, the metal layer 2116a is electrically grounded or electrically floating. In one of the embodiments, the metal layer 2116a is electrically insulated from the metal layer 2117. Accordingly, the dummy openings 211a and 212a may be electrically connected to a ground electrode and electrically insulated from the functional vias 214 and 215.

Referring to FIG. 5 and FIG. 8, in some exemplary embodiments, the second integrated circuit 210 further include at least one (functional) pad 213 (four pads are illustrated but not limited thereto). The pads 213 are electrically insulated from the dummy opening 211a and the dummy opening 212a. In some embodiments, the pads 213 are electrically connected to the functional vias 214 and/or the functional vias 215. In fact, in some of the implementation, the functional vias 214 are the vias in the pads 213 for electrically connecting the pads 213 and the top metal of the first integrated circuit 110. In some embodiments, the dummy opening 211a may be disposed between the pad 213 and an edge of the second integrated circuit 210 closest to the pad 213. In a wafer level process, the dummy openings is 211a is disposed between the pad 213 and respective one of the scribe lines SL that is closest to the pad 213 as shown in FIG. 5.

Accordingly, in the present embodiments, the dummy opening 211a is disposed between the pad 213 and an edge (i.e. scribe line SL) of the second integrated circuit 210 (i.e. the second wafer 200) closest to the pad 213. Thereby, when the crack is occured from the scribe line SL, it would stop at the dummy opening 211a instead of extend all the way toward the pad 213. In some embodiments, there are a plurality of dummy opening 211a arranged along a direction parallel to the edge (i.e. scribe line SL) of the second integrated circuit 210 (i.e. the second wafer 200) as it is shown in FIG. 5.

In some embodiments, the dummy opening 212a may be disposed on a region corresponding to a periphery of the cavity 118. It is shown that voids V1 are more likely occurred around the cavity 118, so by forming the dummy opening 212a at the region around the cavity 118, the air trapped in the voids V1 can be release. Therefore, the risk of delamination between the first integrated circuits 110 and the second integrated circuit 210 can be avoid or at least significantly reduced. However, the disclosure does not limit the disposition of the dummy openings 211a and 212a. The locations of the dummy openings 211a and 212a may be modified according to actual requirements of the semiconductor device 10a.

With such configuration, the dummy opening 211a and 212a not only can release the air trapped in the void V1 between the first integrated circuits 110 and the second integrated circuit 210, but also can prevent the crack occurred from the scribe line SL to be extended to the pads 213 and damage the semiconductor device 10a. Therefore, risks of delamination between the first integrated circuits 110 and the second integrated circuit 210 can be avoid or at least significantly reduced, and the bonding strength and the reliability of the semiconductor device 10a can be significantly improved.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor device includes a first integrated circuit and a second integrated circuit. The first integrated circuit includes a semiconductor substrate and a dielectric layer disposed on a top surface of the semiconductor substrate. The second integrated circuit is disposed on the dielectric layer of the first integrated circuit and includes a dummy opening extending through the second integrated circuit and having a metal layer covering the inner walls of the dummy opening and in contact with the dielectric layer, wherein the metal layer is electrically grounded or electrically floating.

In accordance with some embodiments of the disclosure, a semiconductor device, comprising includes a first wafer and a second wafer. The first wafer includes a semiconductor substrate and a dielectric layer disposed over the semiconductor substrate. The second wafer is disposed on the dielectric layer of the first wafer and includes a plurality of dummy openings extending through the second wafer and having a metal layer covering the inner walls of the dummy openings and in contact with the dielectric layer, wherein the metal layer is electrically grounded or electrically floating.

In accordance with some embodiments of the disclosure, a manufacturing method of a semiconductor device includes the following steps. A first wafer is provided, wherein the first wafer includes a semiconductor substrate and a dielectric layer disposed over the semiconductor substrate. A second wafer is bonded over the dielectric layer of the first wafer. A plurality of through openings are formed on the second wafer, wherein the plurality of through openings extend through the second wafer and reveals the dielectric layer of the first wafer. A metal layer is formed on the plurality of through openings to form a plurality of dummy openings, wherein the metal layer covers the inner walls of the plurality of through openings and in contact with the dielectric layer, and the metal layer is electrically grounded or electrically floating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first integrated circuit comprising a semiconductor substrate and a dielectric layer disposed over the semiconductor substrate; and
   a second integrated circuit disposed on the dielectric layer of the first integrated circuit and comprising a dummy opening extending through the second integrated circuit and having a metal layer covering the dummy opening and in contact with the dielectric layer, wherein the metal layer is electrically grounded or electrically floating.

2. The semiconductor device as claimed in claim 1, wherein the first integrated circuit further comprises a sub dummy opening extending through the dielectric layer and communicating with the dummy opening, and the metal layer covers the sub dummy opening.

3. The semiconductor device as claimed in claim 1, wherein a diameter of the sub dummy opening is substantially smaller than a diameter of the dummy opening.

4. The semiconductor device as claimed in claim 1, wherein the second integrated circuit comprises a pad electrically insulated from the dummy opening, and the dummy opening is disposed between the pad and an edge of the second integrated circuit closest to the pad.

5. The semiconductor device as claimed in claim 4, wherein the dummy opening is a trench extending along a direction parallel to the edge.

6. The semiconductor device as claimed in claim 1, wherein the dummy opening is a dummy via.

7. The semiconductor device as claimed in claim 1, wherein the dielectric layer comprises a cavity, and the dummy opening is disposed on a region corresponding to a periphery of the cavity.

8. The semiconductor device as claimed in claim 7 wherein the cavity reveals an electronic device disposed on the semiconductor substrate.

9. A semiconductor device, comprising:
   a first wafer comprising a plurality of first integrated circuits, wherein one of the plurality of first integrated circuits comprises a semiconductor substrate and a dielectric layer disposed over the semiconductor substrate; and
   a second wafer disposed on the dielectric layer of the first wafer and comprising a plurality of second integrated circuits, wherein one of the plurality of second integrated circuits comprises a plurality of dummy openings extending through the second wafer and having a metal layer covering the dummy openings and in contact with the dielectric layer, wherein the metal layer is electrically grounded or electrically floating.

10. The semiconductor device as claimed in claim 9, wherein the first wafer further comprises a plurality of sub dummy openings extending through the dielectric layer and communicating with respective ones of the plurality of dummy opening, and the metal layer covers the plurality of sub dummy openings.

11. The semiconductor device as claimed in claim 10, wherein a diameter of one of the plurality of sub dummy openings is substantially smaller than a diameter of respective one of the plurality of dummy openings.

12. The semiconductor device as claimed in claim 9, wherein the second wafer further comprises a plurality of integrated circuits and a plurality of scribe lines separating the plurality of integrated circuits, one of the plurality of integrated circuits comprises a pad, and one of the plurality of dummy openings is disposed between the pad and respective one of the plurality of scribe lines closest to the pad.

13. The semiconductor device as claimed in claim 12, wherein the one of the plurality of dummy openings is a trench extending along a direction parallel to the one of the scribe lines.

14. The semiconductor device as claimed in claim 9, wherein the plurality of dummy openings are dummy vias.

15. The semiconductor device as claimed in claim 9, wherein the dielectric layer comprises a cavity, and one of the plurality of dummy openings is disposed on a region corresponding to a periphery of the cavity.

16. The semiconductor device as claimed in claim 15, wherein the cavity reveals an electronic device disposed on the semiconductor substrate.

17. A manufacturing method of a semiconductor device, comprising:
   providing a first wafer, wherein the first wafer comprises a semiconductor substrate and a dielectric layer disposed over the semiconductor substrate;
   bonding a second wafer over the dielectric layer of the first wafer;
   forming a plurality of through openings on the second wafer, wherein the plurality of through openings extend through the second wafer and reveals the dielectric layer of the first wafer; and
   forming a metal layer on the plurality of through openings to form a plurality of dummy openings, wherein the metal layer covers the inner walls of the plurality of through openings and in contact with the dielectric layer, and the metal layer is electrically grounded or electrically floating.

18. The manufacturing method of the semiconductor device as claimed in claim 17, wherein providing the first wafer further comprises:
   forming a plurality of sub dummy openings on the first wafer, wherein the plurality of sub openings extend through the dielectric layer, and the plurality of through openings are formed correspondingly to communicate with respective ones of the plurality of sub openings.

19. The manufacturing method of the semiconductor device as claimed in claim 16, wherein the metal layer covers the inner walls of the plurality of sub openings to form a plurality of sub dummy opening.

20. The manufacturing method of the semiconductor device as claimed in claim 15, wherein providing the first wafer further comprises:
   forming a cavity on the dielectric layer, wherein at least one of the plurality of dummy openings is formed on a region corresponding to a periphery of the cavity, and the cavity reveals an electronic device disposed on the semiconductor substrate.

* * * * *